US009156068B2

United States Patent
Klebanoff et al.

(10) Patent No.: US 9,156,068 B2
(45) Date of Patent: Oct. 13, 2015

(54) METHODS AND APPARATUS FOR CLEANING OBJECTS IN A CHAMBER OF AN OPTICAL INSTRUMENT BY GENERATING REACTIVE IONS USING PHOTON RADIATION

(71) Applicants: KLA-Tencor Corporation, Milpitas, CA (US); Sandia Corporation, Albuquerque, NM (US)

(72) Inventors: Leonard E. Klebanoff, Dublin, CA (US); Gildardo R. Delgado, Livermore, CA (US); Jeromy T. Hollenshead, Albuquerque, NM (US); Karl R. Umstadter, Livermore, CA (US); Elena Starodub, Sunnyvale, CA (US); Guorong V. Zhuang, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/482,510

(22) Filed: Sep. 10, 2014

(65) Prior Publication Data
US 2014/0374619 A1    Dec. 25, 2014

Related U.S. Application Data

(63) Continuation of application No. PCT/US2014/017963, filed on Feb. 24, 2014.

(60) Provisional application No. 61/768,904, filed on Feb. 25, 2013.

(51) Int. Cl.
*H01J 49/14* (2006.01)
*H01J 49/24* (2006.01)
(Continued)

(52) U.S. Cl.
CPC .......... *B08B 7/0057* (2013.01); *G03F 7/70925* (2013.01)

(58) Field of Classification Search
CPC .............. B08B 7/0057; G03F 7/70033; G03F 7/70925; G02B 26/0816; C01B 3/02
USPC .................. 250/504 R, 431, 365, 372, 493.1; 355/67
See application file for complete search history.

(56) References Cited

U.S. PATENT DOCUMENTS

| 7,211,810 B2 | 5/2007 | Bakker et al. |
| 7,230,258 B2 | 6/2007 | Ruzic et al. |

(Continued)

FOREIGN PATENT DOCUMENTS

WO    2004065658    8/2004

OTHER PUBLICATIONS

Hollmann, E. M., and A. Yu. Pigarov. "Measurement and modeling of molecular ion concentrations in a hydrogen reflecx-arc discharge", Physic of Plasmas, vol. 9, No. 10, Oct. 2002 American Institute of Physics, pp. 4330-4339.

(Continued)

*Primary Examiner* — Nikita Wells
(74) *Attorney, Agent, or Firm* — Simpson & Simpson, PLLC

(57) ABSTRACT

An optical instrument, including a chamber, an object exposed to an interior of the chamber, a source of low-pressure gas, the gas comprising at least one of low-pressure molecular hydrogen gas, low-pressure molecular oxygen and a low-pressure noble gas, the source of low pressure gas being fluidly coupled to the chamber, a low voltage source electrically coupled between the object and a remaining portion of the instrument that is exposed to the interior of the chamber so as to maintain the object at a low voltage relative to the remaining portion, and an EUV/VUV light source adapted to direct EUV/VUV light through the low pressure gas in the chamber onto the object. In such a system, when the EUV/VUV light source is activated ions of the low-pressure gas are formed and directed to the object. The ions may be ions of Hydrogen, Oxygen or a noble gas.

38 Claims, 2 Drawing Sheets

(51) Int. Cl.
*B08B 7/00* (2006.01)
*G03F 7/20* (2006.01)

(56) References Cited

U.S. PATENT DOCUMENTS

| | | | |
|---|---|---|---|
| 7,311,109 B2 | 12/2007 | Kim et al. | |
| 7,462,850 B2 * | 12/2008 | Banine et al. | 250/504 R |
| 7,750,326 B2 | 7/2010 | Van Herpen et al. | |
| 8,076,655 B2 | 12/2011 | Derra et al. | |
| 8,633,459 B2 * | 1/2014 | Bykanov et al. | 250/504 R |
| 2003/0051739 A1 | 3/2003 | Klebanoff et al. | |
| 2004/0119394 A1 | 6/2004 | Klebanoff et al. | |
| 2006/0138514 A1 | 6/2006 | Oh et al. | |
| 2009/0061327 A1 | 3/2009 | Sengupta et al. | |
| 2010/0288302 A1 | 11/2010 | Ehm et al. | |
| 2011/0048452 A1 | 3/2011 | Zink et al. | |
| 2012/0223256 A1 | 9/2012 | Bykanov et al. | |
| 2014/0231659 A1 * | 8/2014 | Chilese et al. | 250/372 |
| 2014/0261568 A1 * | 9/2014 | Delgado et al. | 134/30 |

OTHER PUBLICATIONS

Gioumousis, George, and D. P. Stevenson. "Reactions of Gaseous Molecule Ions with Gaseous Molecules. V. Theory", AIP The Journal of Chemical Physics 29, 294 (1958), http://dx.doi.org/10.1063/1.1744477.

Tichenor, Daniel A., et al. "System Integration and Performance of the EUV Engineering Test Stand," Emerging Lithographic Technologies V, Proceedings of SPIE, vol. 4343 (2001), http://proceedings.spiedigitallibrary.org on Apr. 17, 2015, pp. 19-37.

* cited by examiner

METHODS AND APPARATUS FOR CLEANING OBJECTS IN A CHAMBER OF AN OPTICAL INSTRUMENT BY GENERATING REACTIVE IONS USING PHOTON RADIATION

CROSS-REFERENCE TO RELATED APPLICATIONS

This application is filed under 35 U.S.C. §120 and §365(c) as a continuation of International Patent Application No. PCT/US2014/017963, filed Feb. 24, 2014, which application claims the benefit under 35 U.S.C. §119(e) of U.S. Provisional Application No. 61/768,904, filed Feb. 25, 2013, which applications are hereby incorporated by reference herein in their entirety.

STATEMENT REGARDING FEDERALLY SPONSORED RESEARCH OR DEVELOPMENT

This invention was made with government support under CRADA SC11/01785.00 awarded by Sandia Corporation (a wholly-owned subsidiary of Lockheed Martin Corporation) as operator of Sandia National Laboratories under its U.S. Department of Energy Contract No. DE-AC04-94AL85000. The government has certain rights in the invention.

FIELD OF THE INVENTION

Methods and apparatus for cleaning objects in a chamber of an optical instrument by generating reactive ions using photon radiation.

BACKGROUND OF THE INVENTION

Surfaces of optical components in a chamber of an instruments using Extreme Ultraviolet (EUV) light can become contaminated with carbon-containing or oxygen-containing matter resulting in a reduced optical throughput. Various techniques for removal of such contamination are known.

According to one approach, radio frequency (RF) or direct current (DC) discharge devices produce a plasma to generate hydrogen ions to react with the contaminants on surfaces of the optical components and generate a volatile material that disassociates from the surface. Disadvantages of such approaches include: (1) uncontrolled and indiscriminate acceleration of ions in the direction of the optical component causing damage due to ion sputtering, (2) introduction of additional contamination into the instrument due to sputtering of an electrode used to produce the RF or DC voltages, (3) the ions generated are dispersed such that many optical components in a chamber of an apparatus are exposed to the ions, and (4) electrical disturbances arising from the RF and DC devices make them inappropriate for use with lithographic instruments.

According to another approach, a hot filament is used to produce hydrogen radicals (also referred to herein as atomic hydrogen). The radicals react with the contaminants on surfaces of the optical components thereby forming volatile products such as $CH_4$ and $H_2O$ that disassociate from the surface.

Disadvantages of such approaches include: (1) thermal disturbances arising from the use of heated filaments (which can reach temperatures of 1500° C.) causing thermal disturbances in an instrument that requires tight temperature control, and (2) evaporation of filament material can cause deposits on optical surfaces possibly causing irreversible contamination of the optical surface.

Accordingly, there remains a need for improved cleaning of optical component in optical instruments.

BRIEF SUMMARY OF THE INVENTION

An aspect of the present invention is directed to an optical instrument, comprising a chamber, an object exposed to an interior of the chamber, a source of low-pressure gas, the gas comprising at least one of low-pressure molecular hydrogen gas, low-pressure molecular oxygen and a low-pressure noble gas, the source of low pressure gas being fluidly coupled to the chamber, a low voltage source electrically coupled between the object and a remaining portion of the instrument that is exposed to the interior of the chamber so as to maintain the object at a low voltage relative to the remaining portion, and an EUV/VUV light source adapted to direct EUV/VUV light through the low pressure gas in the chamber onto the object, whereby when the EUV/VUV light source is activated ions of the low-pressure gas are formed and directed to the object.

In some embodiments, the low-pressure gas is molecular Hydrogen gas at a pressure of 0.5-500 Pa, whereby when the EUV/VUV light source is activated, $H_3^+$, $H_2^+$, $H^+$ ions are formed and directed to the object. In some embodiments, the low-pressure gas is a noble gas at a pressure of 0.1-50 Pa, whereby when the EUV/VUV light source is activated, noble gas ions are formed and directed to the object. In some embodiments, the low-pressure gas is molecular Oxygen gas at a pressure of 0.1-50 Pa, whereby when the EUV/VUV light source is activated, Oxygen ions are formed and directed to the object.

The chamber may be configured with one or more exit ports to cause the low-pressure gas to flow.

The object may be an optical component. The optical component may comprise one of a mirror, a lens, a filter, a sensor, a mask. The object may comprise at least one of a portion of a wall of the chamber and an optical stage. In some embodiments, the remaining portion is maintained at ground. The low voltage may be a voltage having a magnitude equal to or less than 50 excluding zero volts. The low voltage may be a voltage having a magnitude equal to or less than 5-50 Volts. The low voltage may be a negative voltage. The low voltage may be a positive voltage. In some embodiments, the low voltage source is adapted to maintain the object at the low voltage over multiple periods of time using an AC signal. The low voltage source may be adapted to maintain the object at the low voltage only during periods of time when the EUV/VUV light source does not project light through the chamber.

The system may be adapted to selectively direct the low-pressure gas onto a surface of the object.

In some embodiments, the instrument is one of a mask inspection system, a lithographic system and a metrology system.

The ions may comprise at least one of $H_3^+$, $H_2^+$, $H^+$ ions, Oxygen ions (e.g., $O^{2+}$, $O^+$, $O^-$) and noble gas ions.

Another aspect of the invention is directed to a method of contamination protection for use in an optical instrument, comprising providing an object exposed to an interior of a chamber of the instrument, providing low-pressure gas comprising at least one of low-pressure molecular hydrogen gas, low-pressure molecular oxygen gas, and a low-pressure noble gas in the chamber, maintaining the object at a low voltage relative to a remaining portion of the instrument, and projecting EUV/VUV light through the low pressure gas onto the object, whereby ions of the low-pressure gas are formed and directed to the object.

The method may further comprise operating the instrument to one of (1) capture an image of an item in the chamber or (2) lithographically process a substrate in the chamber, while providing the low-pressure gas in the chamber.

The method may further comprise operating the instrument to one of (1) capture an image of an item in the chamber or (2) to lithographically process a substrate in the chamber, while providing a second gas for normal operation or providing at least a near-vacuum condition in the chamber for normal operation, prior to the step of providing the low-pressure gas.

The method may further comprise projecting light that is outside of the EUV/VUV range through the low-pressure gas onto the object.

In some embodiments, the step of providing low-pressure gas in the chamber comprises providing low-pressure, molecular Hydrogen gas at a pressure of 0.5-500 Pa. In some embodiments, the step of providing low-pressure gas in the chamber comprises providing molecular Oxygen gas at a pressure of 0.5-50 Pa. In some embodiments, the step of providing low-pressure gas in the chamber comprises providing a noble gas at a pressure of 0.5-50 Pa.

The method may further comprise flowing the low-pressure gas in the chamber.

The object may be an optical component. The object may comprise at least one of a portion of a wall of the chamber and an optical stage.

In some embodiments, the remaining portion is maintained at ground.

The step of maintaining the object at a low voltage may comprise maintaining the object at a low voltage over multiple periods using an AC signal.

The step of maintaining the object at a low voltage may comprise providing the low voltage only during periods of time when the EUV/VUV light source does not project light through the chamber.

The method may further comprise selectively directing the low-pressure gas onto a surface of the object.

The low voltage may be a voltage having a magnitude equal to or less than 50 Volts excluding zero Volts. The low voltage may be a voltage having a magnitude equal to or less than 5-50 Volts. The low voltage may be a negative voltage. The low voltage may be a positive voltage.

The instrument may be one of a mask inspection system, a lithographic system and a metrology system. The ions may comprise at least one of $H_3^+$, $H_2^+$, $H^+$ ions, Oxygen ions and noble gas ions.

BRIEF DESCRIPTION OF THE SEVERAL VIEWS OF THE DRAWING

The nature and mode of operation of the present invention will now be more fully described in the following detailed description of the invention taken with the accompanying drawing figure, in which.

DETAILED DESCRIPTION OF THE INVENTION

Figure 1:
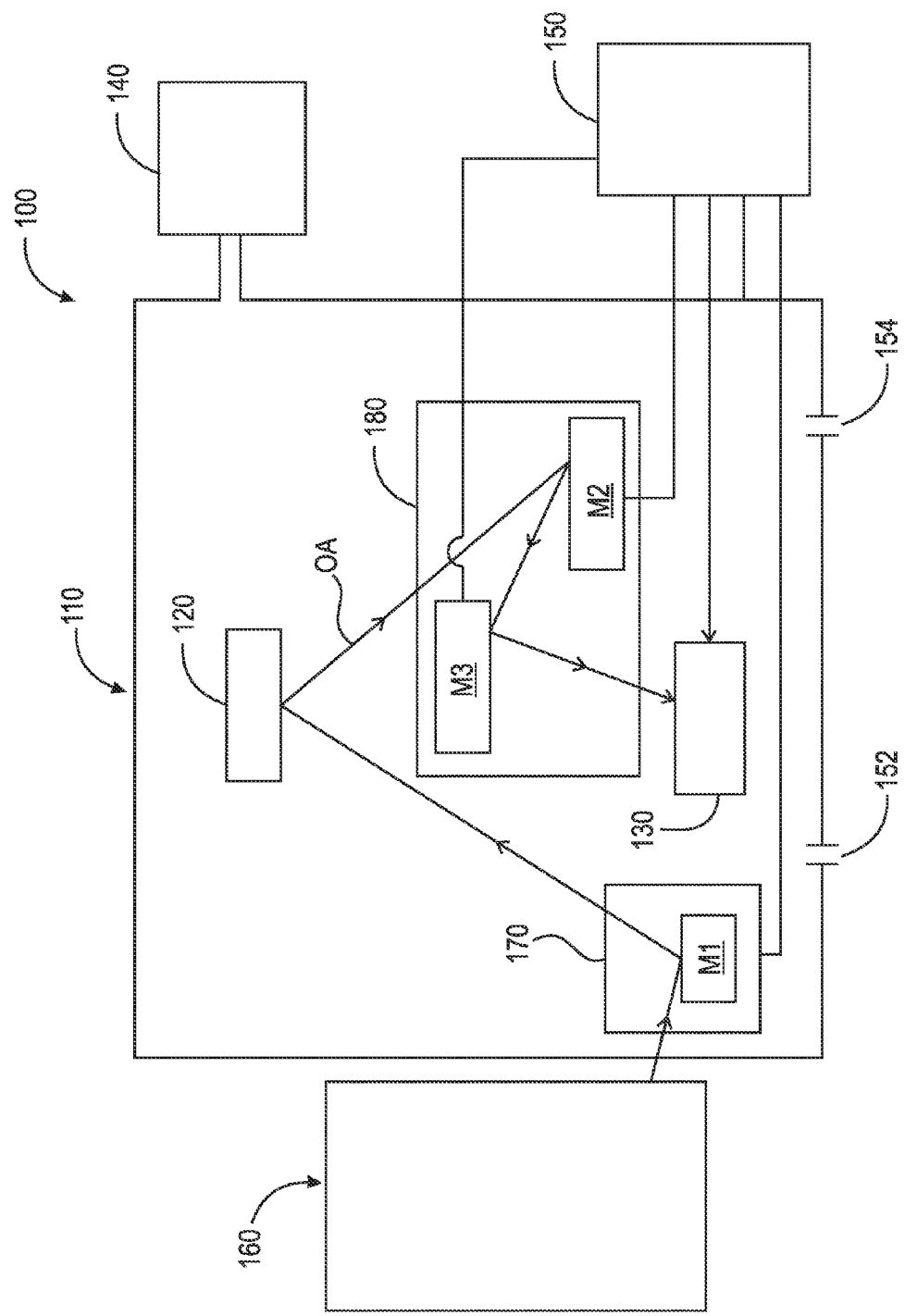
FIG. 1 is a schematic illustration of an example of an embodiment of an EUV/VUV actinic mask inspection system or an EUV/VUV lithographic system or an EUV/VUV metrology system having cleaning capabilities according to aspects of the present invention.

Aspects of the present invention are directed to optical instruments (e.g., mask inspection systems or lithographic systems or metrology systems which normally operate at EUV wavelengths (5-20 nm) and/or VUV wavelengths (20-180 nm) or which operate outside of said bands but have a secondary source providing light in at least one of said bands) having cleaning capabilities including an ability to generate hydrogen ions produced using EUV light and/or VUV light.) from an EUV/VUV light source. It is to be appreciated that, because EUV/VUV light can be projected into a chamber of the above-identified optical apparatus, the system allows in situ cleaning of optical components of said system, some portion of a chamber wall of the system, a mechanical component (e.g., a holder or stage) or other suitable objects in an instrument. According to an aspect of the invention, $H_2$ molecules present in the chamber absorb EUV/VUV light from the EUV/VUV source system where $H_2$ has a high absorption rate or other ionizing light that may be present in the instrument.

The inventors have applied a discovery that, in the presence of ionizing radiation, such as EUV/VUV light, an $H_2$ molecule emits a photoelectron and ultimately produces $H_3^+$ in high yield. The theorized mechanism of $H_3$ formation is as follows: each $H_2$ molecule having an EUV/VUV photon incident thereon emits a photoelectron. As a result, $H_2$ ions are generated at a high yield rate (approximately 98%). A remaining portion (approximately 2%) of the ionized $H_2$ generates $H^+$ and atomic Hydrogen (also referred to as Hydrogen radical). The $H_2^+$ ions then existing in a sea of $H_2$ molecules react to form $H_3^+$ and an H radical.

The inventors applied this discovery of the existence of an abundance of ions ($H_3^+$, $H_2^+$ and $H^+$) in a chamber of an optical apparatus by providing an object in the chamber with a negative low voltage (e.g., minus 5 to minus 50 V) to selectively direct the ions to a surface of the object causing the ions to react with Carbon and Oxygen contaminants disposed on the surface. For example, according to one reaction scheme, $H_3^+$ reacts directly with any Carbon or Oxygen present to form volatile molecules such as $CH_4$ and $H_2O$ which readily disassociate from a surface of the optical component. According to another reaction scheme the $H_3^+$ ion is neutralized at the surface forming $H_2$ gas and a Hydrogen radical with the radical reacting with any Carbon or Oxygen present to form $CH_4$ and $H_2O$.

Although in the above discussion Hydrogen was described as the low pressure gas present in the chamber, Hydrogen, Oxygen or a noble gas (He, Ne, Ar, Kr, Xe and Rd) or a combination of any of said low pressure gases could be used instead (i.e., maintained in the chamber and photo-ionized by EUV/VUV light).

Although the generation of and cleaning with positive ions was discussed above, it is to be appreciated that negative ions (e.g., electronegative Oxygen ions) can also be generated by EUV/VUV light and attracted to a surface to provide cleaning using a low positive voltage (e.g., 5-50 V).

Accordingly, the inventors have developed techniques using photo-ionization that are capable of cleaning (1) by using ions with low thermal energies, (2) without the use of a heated electrode, and (3) where the reactive species are targeted at only selected portions of a system by use of a low voltage. Typically, during cleaning, since relatively little heat is generated, the chamber is maintained at room temperature (about 22° C.) and no optical surface is heated to a temperature above 50° C.

FIG. 1 is a schematic illustration of an example of an embodiment of a system 100 (also referred to herein as an instrument) such as an EUV/VUV actinic mask inspection system or an EUV/VUV lithographic system or an EUV/VUV metrology system having cleaning capabilities according to aspects of the present invention. System 100 comprises a chamber 110, optical components (e.g., mirrors M1-M3, mask 120, component 130) disposed in the chamber, a source of low-pressure molecular gas 140, a low-voltage source 150 and an EUV/VUV light source 160.

Chamber 110 is a conventional chamber for use with EUV/VUV light and is adapted to maintain the optical components which are disposed in the chamber for directing EUV/VUV light though the chamber toward component 130. In the illustrated embodiment, an illumination system 170 comprising one mirror M1 and a projection system 180 comprising two mirrors M2, M3 are shown. Although three mirrors are shown in the chamber, any suitable number and types of optical components may be disposed in the chamber for illumination and projection of the light. For example, the optical components in an illumination system or the projection system may comprise one or more of a mirror, a lens, a filter, a sensor, a mask or other components which are now known or later developed.

Source 140 provides low-pressure, molecular Hydrogen gas or low-pressure, molecular Oxygen or low-pressure, noble gas (He, Ne, Ar, Kr, Xe, Rd) or a combination thereof to chamber 110. Source 140 may be fluidly coupled to the chamber using any suitable technique to selectively provide gas into the chamber. The term "low pressure" is defined herein to mean, in the case of molecular Hydrogen, 0.5-500 Pascals (Pa), in the case of molecular Oxygen, 0.1-50 Pa, and in the case of Helium Neon, Argon, Krypton, Xenon, Radon 0.1-50 Pa. In some embodiments, the gas is molecular Hydrogen at a gas pressure of 1-200 Pa. In some embodiments, the gas is molecular Hydrogen at a gas pressure of 5-50 Pa. In some embodiments, the gas is molecular Oxygen at a gas pressure of 0.5-10 Pa. It will be appreciated that the gas pressure for a given embodiment is selected to provide sufficient ions in an appropriate location within a chamber to achieve the desired cleaning task(s) and is dependent, at least in part on, the photon flux that is available from light source 160, the photon capture cross-section of the low-pressure gas at the photon energies, the distribution of the gas in the chamber, and the desired optical path length of the photons.

In some embodiments, it is advantageous if the low pressure gas flows through chamber 110. In such embodiments, one or more exit ports 152, 154 may be provided which are at a lower pressure than the low pressure gas from source 140. In some embodiments, the flow is directed toward a portion of the apparatus to be cleaned to effect the distribution of gas in the chamber by increasing the gas density locally such that ions are generated in greater amount near a surface of the object.

Due to the high transmission rate for EUV/VUV light of the above-identified low pressure gases, the low pressure gas may be present in the chamber during normal operation of the system (e.g. during image capture for an inspection system or exposure during lithography in a lithographic system) as well as during cleaning. Alternatively, the chamber may be maintained as a near vacuum or be filled with another gas during normal operation with the low-pressure gas to be used for cleaning being introduced into the chamber prior to any cleaning step.

In the illustrated embodiment, low voltage source 150 is electrically coupled between one or more of the optical components or other objects disposed in the chamber (e.g., mirrors M1-M3, mask 120, component 130) that are to be cleaned and a remaining portion of the apparatus, the remaining portion being exposed to the interior of the chamber. The optical component is thereby maintained at a low positive or negative voltage relative to the remaining portion. The remaining portion is typically maintained at ground. For example, the remaining portion may include one or more optical components that are not being maintained at the low voltage, one or more portions of the chamber walls or another portion of the system. It will be appreciated that, by maintaining the optical component at low negative voltage relative to another portion, the positive ions generated by the light will be attracted to the optical component, and by maintaining the optical component at low positive voltage relative to another portion, the negative ions generated by the light will be attracted to the optical component. It will also be appreciated that, in a given embodiment, attracting positive ions may offer an option of a cleaning that is more or less vigorous than the cleaning offered by negative ions. The term "low voltage" is defined herein to mean a voltage having a magnitude that is equal to less than +/−50 V excluding zero voltage. In some embodiments, the voltage difference is in the range 5-50 V or −5 to −50 V, for example, to provide sufficient voltage difference such that the ions overcome any sheath of plasma that may exist over the object to be cleaned. In some embodiments, the voltage difference is in the range +5 to +15 V or −5 to −15 V. It is to be appreciated that avoiding voltages having a magnitude greater than 50 V reduces the likelihood of an occurrence of arcing.

The optical component may be maintained at the negative voltage for only selected periods of time. For example, the voltage may be provided by an AC signal such as a pulsed AC signal. Such a configuration may provide advantages such as decreasing current draw and decreasing the likelihood of any arcing that may occur. In some embodiments, voltage source 150 may be configured to maintain the optical component at the low voltage only during periods of time when EUV/VUV light source 160 is off or otherwise not projecting light through the chamber, such as between flashes of light.

Although the above embodiment was described with an optical component being maintained at a low voltage, it is to be appreciated that, in some embodiments, the low voltage source may be electrically coupled between any object exposed to the interior of the chamber (e.g., an optical component, a non-optical component (e.g., a holder or a stage), or a portion of the chamber wall) that is capable of holding a charge and a remaining portion of the apparatus that is exposed to the interior of the chamber so as to maintain the object at a low voltage relative to the remaining portion. It will be appreciated that an object so positioned will have a surface that will be exposed to ions generated in the chamber.

EUV/VUV light source 160 is adapted to direct light through the low pressure gas in chamber 110 onto any appropriate optical components (e.g., mirrors M1-M3, mask 120, component 130) including any optical component that is maintained at the low voltage as described above. The optical components (e.g., mirrors M1-M3, mask 120) direct the light toward component 130. Depending on the nature of the system 100, for example, component 130 may be a sensor to receive an image of mask 120 or a semiconductor to be lithographically processed.

EUV/VUV light source 160 may be constructed in any appropriate manner to produce light in the EUV/VUV range, for example, using a plasma or an electrical discharge. An example of an EUV wavelength that is commonly used for normal operation of an EUV instrument and is suitable for cleaning is 13.5 nm+/−2%.

It will be appreciated that, in some embodiments, the source produces light that is outside of the EUV/VUV range in addition to EUV/VUV light. For example, in some such embodiments, it is advantageous to direct the out of band light through the low pressure gas in the chamber along with the EUV/VUV light to produce additional ions.

Figure 2:
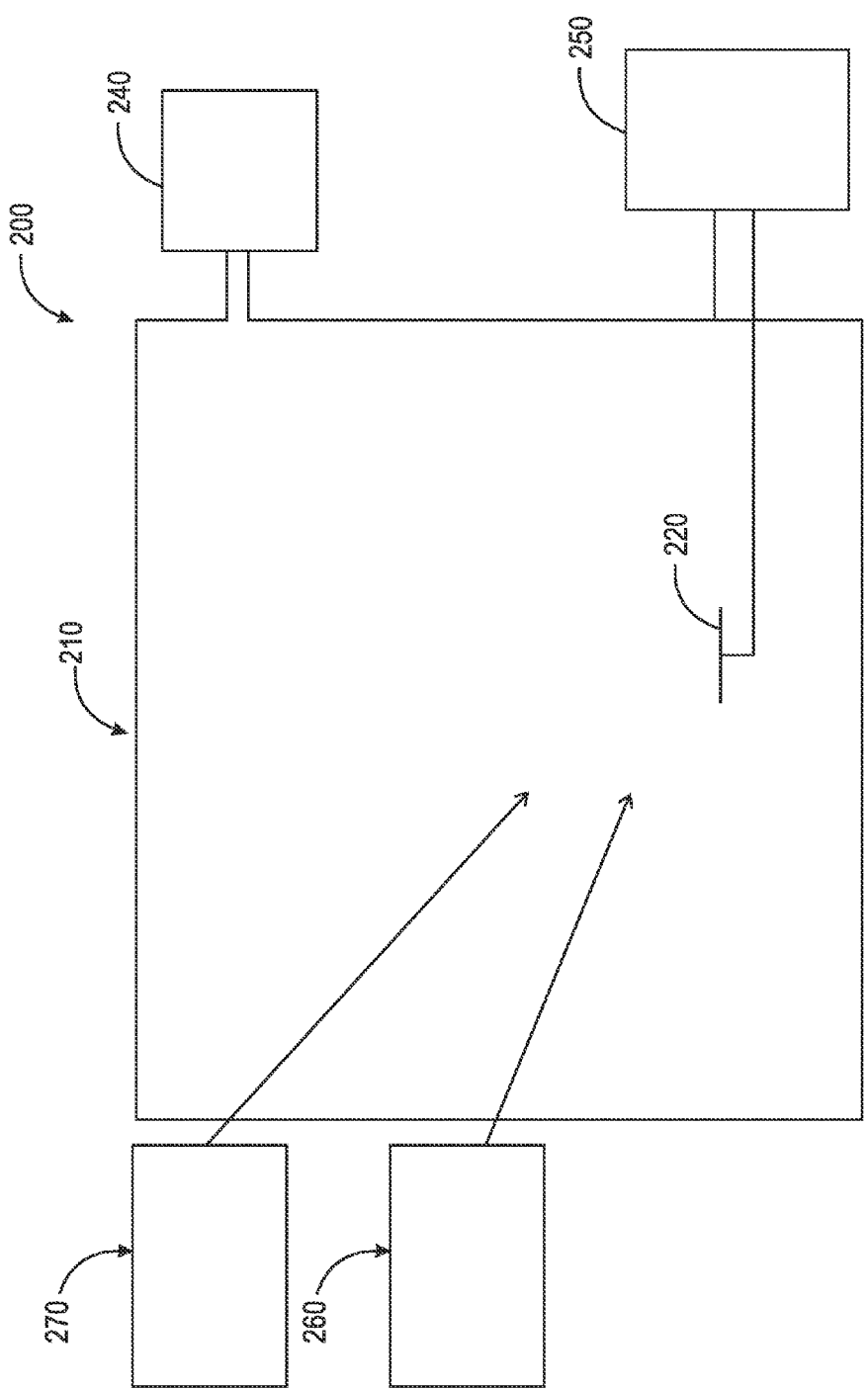
FIG. 2 is a schematic illustration of another example of an embodiment of an optical instrument having cleaning capabilities according to aspects of the present invention.

FIG. 2 is a schematic illustration of another example of an embodiment of an optical instrument 200 having cleaning capabilities according to aspects of the present invention. Optical instrument 200 may be any suitable optical instrument for use with EUV/VUV light.

Optical instrument 200 comprises a chamber 210, an object 220 exposed to an interior of the chamber, a source of low-pressure gas 240, a low voltage source 250, an EUV/VUV light source 260. The optical instrument may include a second light source 270 for normal operation of the instrument if the instrument does not use EUV/VUV light during its normal operation. Accordingly, in such instruments, second light source 270 provides light of any suitable wavelength for normal operation of the instrument and EUV/VUV light source 260 is activated for cleaning of the instrument.

As described above, the low pressure gas provided by source 240 comprises at least one of low-pressure molecular hydrogen gas, low-pressure molecular oxygen and a low-pressure noble gas, and is fluidly coupled to chamber 210.

Also as described above, voltage source 250 is coupled between the object 220 and a remaining portion of the instrument that is exposed to the interior of chamber 210 so as to maintain object 220 at a low voltage relative to the remaining portion.

Also as described above, EUV/VUV light source 260 is adapted to direct EUV/VUV light through the low pressure gas in chamber 210 onto object 220, such that when EUV/VUV light source 260 is activated ions of the low-pressure gas are formed and directed to object 220.

What is claimed is:

1. An optical instrument, comprising:
   a chamber;
   an object exposed to an interior of the chamber;
   a source of low-pressure gas, the gas comprising at least one of low-pressure molecular hydrogen gas, low-pressure molecular oxygen and a low-pressure noble gas, the source of low pressure gas being fluidly coupled to the chamber;
   a low voltage source electrically coupled between the object and a remaining portion of the instrument that is exposed to the interior of the chamber so as to maintain the object at a low voltage relative to the remaining portion; and
   an EUV/VUV light source adapted to direct EUV/VUV light through the low pressure gas in the chamber onto the object, whereby when the EUV/VUV light source is activated ions of the low-pressure gas are formed and directed to the object.

2. The system of claim 1, wherein the low-pressure gas is molecular Hydrogen gas at a pressure of 0.5-500 Pa, whereby when the EUV/VUV light source is activated, $H_3^+$, $H_2^+$, $H^+$ ions are formed and directed to the object.

3. The system of claim 1, wherein the low-pressure gas is a noble gas at a pressure of 0.1-50 Pa, whereby when the EUV/VUV light source is activated, noble gas ions are formed and directed to the object.

4. The system of claim 1, wherein the low-pressure gas is molecular Oxygen gas at a pressure of 0.1-50 Pa, whereby when the EUV/VUV light source is activated, Oxygen ions are formed and directed to the object.

5. The system of claim 1, wherein the chamber is configured with one or more exit ports to cause the low-pressure gas to flow.

6. The system of claim 1, wherein the object is an optical component.

7. The system of claim 6, wherein the optical component comprises one of a mirror, a lens, a filter, a sensor, a mask.

8. The system of claim 1, wherein the object comprises at least one of a portion of a wall of the chamber and an optical stage.

9. The system of claim 1, wherein the remaining portion is maintained at ground.

10. The system of claim 1, wherein the low voltage is a voltage having a magnitude equal to or less than 50 excluding zero volts.

11. The system of claim 1, wherein the low voltage is a voltage having a magnitude equal to or less than 5-50 Volts.

12. The system of claim 1, wherein the low voltage is a negative voltage.

13. The system of claim 1, wherein the low voltage is a positive voltage.

14. The system of claim 1, wherein the low voltage source is adapted to maintain the object at the low voltage over multiple periods of time using an AC signal.

15. The system of claim 1, wherein the low voltage source is adapted to maintain the object at the low voltage only during periods of time when the EUV/VUV light source does not project light through the chamber.

16. The system of claim 1, wherein the system is adapted to selectively direct the low-pressure gas onto a surface of the object.

17. The optical instrument of claim 1, wherein the instrument is one of a mask inspection system, a lithographic system and a metrology system.

18. The optical instrument of claim 1, wherein the ions comprise at least one of $H_3^+$, $H_2^+$, $H^+$ ions, Oxygen ions and noble gas ions.

19. A method of contamination protection for use in an optical instrument, comprising:
   providing an object exposed to an interior of a chamber of the instrument;
   providing low-pressure gas comprising at least one of low-pressure molecular hydrogen gas, low-pressure molecular oxygen gas, and a low-pressure noble gas in the chamber;
   maintaining the object at a low voltage relative to a remaining portion of the instrument; and
   projecting EUV/VUV light through the low pressure gas onto the object, whereby ions of the low-pressure gas are formed and directed to the object.

20. The method of claim 19, wherein the method further comprises operating the instrument to one of (1) capture an image of an item in the chamber or (2) lithographically process a substrate in the chamber, while providing the low-pressure gas in the chamber.

21. The method of claim 19, wherein the method further comprises operating the instrument to one of (1) capture an image of an item in the chamber or (2) to lithographically process a substrate in the chamber, while providing a second gas for normal operation or providing at least a near-vacuum condition in the chamber for normal operation, prior to the step of providing the low-pressure gas.

22. The method of claim 19, further comprising projecting light that is outside of the EUV/VUV range through the low-pressure gas onto the object.

23. The method of claim 19, wherein the step of providing low-pressure gas in the chamber comprises providing low-pressure, molecular Hydrogen gas at a pressure of 0.5-500 Pa.

24. The method of claim 19, wherein the step of providing low-pressure gas in the chamber comprises providing molecular Oxygen gas at a pressure of 0.5-50 Pa.

25. The method of claim 19, wherein the step of providing low-pressure gas in the chamber comprises providing a noble gas at a pressure of 0.5-50 Pa.

26. The method of claim 19, further comprising flowing the low-pressure gas in the chamber.

27. The method of claim 19, wherein the object is an optical component.

28. The method of claim 19, wherein the object comprises at least one of a portion of a wall of the chamber and an optical stage.

29. The method of claim 19, wherein the remaining portion is maintained at ground.

30. The method of claim 19, wherein the step of maintaining the object at a low voltage comprises maintaining the object at a low voltage over multiple periods using an AC signal.

31. The method of claim 19, wherein the step of maintaining the object at a low voltage comprises providing the low voltage only during periods of time when the EUV/VUV light source does not project light through the chamber.

32. The method of claim 19, further comprising selectively directing the low-pressure gas onto a surface of the object.

33. The method of claim 19, wherein the low voltage is a voltage having a magnitude equal to or less than 50 Volts excluding zero Volts.

34. The method of claim 19, wherein the low voltage is a voltage having a magnitude equal to or less than 5-50 Volts.

35. The method of claim 19, wherein the low voltage is a negative voltage.

36. The method of claim 19, wherein the low voltage is a positive voltage.

37. The method of claim 19, wherein the instrument is one of a mask inspection system, a lithographic system and a metrology system.

38. The method of claim 19, wherein the ions comprise at least one of $H_3^+$, $H_2^+$, $H^+$ ions, Oxygen ions and noble gas ions.

* * * * *